US006785309B2

(12) United States Patent
Wesström

(10) Patent No.: US 6,785,309 B2
(45) Date of Patent: Aug. 31, 2004

(54) METHOD FOR FREQUENCY AND MODE STABILISATION OF A TUNEABLE LASER THAT HAS AT LEAST THREE SECTIONS

(75) Inventor: Jan-Olof Wesström, Stockholm (SE)

(73) Assignee: ADC Telecommunicatiions, Inc., Eden Prairie, MN (US)

( * ) Notice: Subject to any disclaimer, the term of this patent is extended or adjusted under 35 U.S.C. 154(b) by 0 days.

(21) Appl. No.: 10/239,554

(22) PCT Filed: Mar. 7, 2001

(86) PCT No.: PCT/SE01/00479

§ 371 (c)(1),
(2), (4) Date: Nov. 18, 2002

(87) PCT Pub. No.: WO01/76029

PCT Pub. Date: Oct. 11, 2001

(65) Prior Publication Data

US 2003/0118062 A1 Jun. 26, 2003

(51) Int. Cl.[7] .................................................. H01S 3/00
(52) U.S. Cl. ................. 372/29.02; 372/38.07; 372/29.015; 372/20
(58) Field of Search ......................................... 372/38.07

(56) References Cited

U.S. PATENT DOCUMENTS

| 5,299,045 A | * | 3/1994 | Sekiguchi ..................... 398/95 |
| 5,351,253 A | * | 9/1994 | Wong ....................... 372/29.02 |
| 5,691,989 A | * | 11/1997 | Rakuljic et al. ............... 372/20 |
| 6,504,856 B1 | * | 1/2003 | Broberg et al. .......... 372/38.07 |

FOREIGN PATENT DOCUMENTS

WO 00/49693 8/2000

OTHER PUBLICATIONS

Ishii et al., "Mode Stabilization Method for Superstructure-Grating DBR Lasers", *Journal of Lightwave Technology*, vol. 16, No. 3, Mar. 1998, pp 433–442.

* cited by examiner

*Primary Examiner*—Don Wong
*Assistant Examiner*—Dung T Nguyen
(74) *Attorney, Agent, or Firm*—Carlson, Caspers, Vandenburgh & Lindquist

(57) ABSTRACT

A method for frequency and mode stabilisation of a tuneable laser that has at least three sections, such as a Bragg laser or GCSR laser, where measurable magnitudes are measured and the laser has been characterised with respect to a number of operation points, and where the values of the measurable magnitudes are stored in a microprocessor or corresponding device. The invention is characterised in that the values of one or more of the measurable magnitudes (E) are caused to be non-extreme values; in that the measurable magnitudes include back power in addition to front power and frequency; and in that control currents (I1, I2, I3; I1, I2, I3, I4) for the gain section (P1), the phase section (N2; N3) and the reflector section (N3; N4) respectively of said laser, and when applicable also for the coupler section (N2) of said laser, are caused to be controlled on the basis of the measured values of said measurable magnitudes while keeping both the front power and back power constant.

5 Claims, 4 Drawing Sheets

METHOD FOR FREQUENCY AND MODE STABILISATION OF A TUNEABLE LASER THAT HAS AT LEAST THREE SECTIONS

FILED OF THE INVENTION

The present invention relates to a method of stabilising frequency and mode of a tuneable laser.

BACKGROUND OF THE INVENTION

Tuneable semiconductor lasers include several different sections through which current is injected, these sections typically being three or four in number. The wavelength, power and mode purity of the lasers can be controlled by adjusting the current in the different sections. Mode purity implies that the laser is at an operation point, i.e. in a combination of the three or four injected drive currents that is characterised by the laser being distanced from a combination of the drive currents with which mode jumps occur and where lasering is stable and sidemode suppression is high.

Special requirements are required for different applications with respect to controlling wavelength. In the case of telecommunications applications, it is necessary that the laser is able to retain its wavelength to a very high degree of accuracy and over a long period of time, after having set the drive currents and the temperature. A typical accuracy is 0.01 nanometer while a typical time period is 20 years.

In order to be able to control the laser, it is necessary to map the behaviour of the laser as a function of the different drive currents. This is necessary after manufacture but prior to using the laser.

It is also highly desirable to be able to lock the wavelength of a laser and have control over the mode in which the laser operates, so that said laser will operate as intended over a long period of time. By mode control is meant optimisation of the laser operation point in operation, either continuously or at regular intervals, so as to eliminate the risk of a mode jump to some other cavity mode. Furthermore, it would be very beneficial if lasers could be automatically compensated for degradation in operation.

Several methods of mobilising the frequency and mode of a tuneable laser are known to the art. Several of these methods involve adjusting a current through a laser section so that the laser will continue to lase at the right frequency, while adjusting the currents through other laser sections while seeking a maximum or minimum in some measurable function, such as the laser output power.

Swedish Patent Specification No. 9900537-3 describes a method of wavelength locking and mode monitoring a tuneable laser. In this method, as with other methods, the laser is controlled at an operation point which lies at an extreme point on the measurable functions.

Certain functions have no usable extreme point. For instance, the output power of a GCSR laser may have a sawtooth configuration. Consequently, no extreme value is reached before the laser jumps to the next mode.

It is often found that the best laser operation point does not lie on a usable extreme point of the measurable functions, since such points often mean that the laser operates close to a mode jump.

Consequently, it is beneficial to lock control of the laser at, for instance, a given gradient of a curve, such as the curve of the output power as a function of reflector current. However, this causes a problem when the laser degrades, since such curves become "stretched" as the laser ages, therewith changing the gradient of the curve.

SUMMARY OF THE INVENTION

The present invention solves the problem associated with the use of values that are not the extreme values of measurable magnitudes for controlling a laser that degrades.

The present invention thus relates to a method of frequency and mode stabilising a tuneable laser that has at least three sections, such as a Bragg laser or a GCSR laser, where measurable magnitudes are measured, said laser having been characterised with respect to a number of operation points, wherein the values of the measurable magnitudes are stored in a microprocessor or corresponding device, and wherein the method is characterised by causing the values of one or more of the measurable magnitudes to be non-extreme values; and is further characterised in that the measurable magnitudes include the back power in addition to the front power and frequency; and in that control currents for the gain section, phase section and reflector section of the laser, and when applicable also the coupler section, are caused to be controlled on the basis of the values measured for the measurable magnitudes while keeping both the front power and the back power constant.

BRIEF DESCRITPION OF THE DRAWINGS

The invention will now be described in more detail with reference to exemplifying embodiments of the invention and also with reference to the accompanying drawings, in which FIG. 1 is a schematic illustration of a laser that includes three sections;

DETAILED DESCRIPTION

Figure 1:
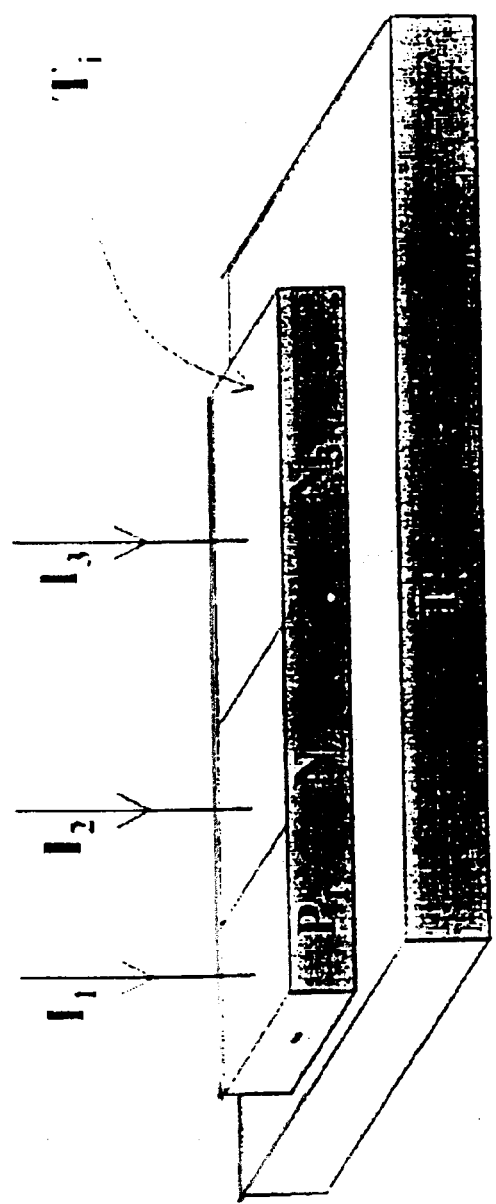

FIG. 1 shows a laser that has three sections P1, N2 and N3 on a carrier TC, where currents I1, I2 and I3 are injected into respective sections.

A laser is controlled by control variables in the form of currents that are injected into the different sections of the laser or in the form of the voltage applied across different sections, and also the carrier temperature T. These variables control a number of laser internal variables, of which the charge carrier density is the most essential. Temperature is ignored in the following, although it can be treated in the same way as the control currents I.

Directly measurable magnitudes, such as the output power and the frequency of the laser and sidemode suppression are all functions of said internal variables.

Only certain combinations of the internal variables result in desired laser properties, such as desired frequency, high sidemode suppression, desired output power, and sufficient distance to mode jumps.

When characterising the laser, good operation points are chosen at different frequencies and these frequencies stored in the form of different currents injected into the various laser sections.

The relationship between the internal variables and the control variables changes as the laser degrades.

However, it is not possible to measure the internal variables.

Almost all measurable variables are functions of the internal variables, wherewith the operation point of the laser will be displaced as a result of said laser degradation when the control currents are used to control the laser by holding said currents constant.

The present invention relates to a method of stabilising frequency and mode in a tuneable laser that has at least three sections, such as a Bragg laser or GCSR laser, where measurable magnitudes are measured, wherein said laser has been characterised with respect to a number of operation points and wherein the values of the measurable magnitudes are stored in a microprocessor or corresponding device.

A Bragg laser has only three sections, these being a gain section (P), phase section (N2) and reflector section (N3). It is easy to measure front power, back power and transmitted frequency.

If the front power becomes too low, it is reasonable to increase the current to the gain section. If the frequency becomes too low, it is reasonable to increase the current to both tuning sections.

Expressed simply, there are several operation points that give the same output power and the same frequency but different back powers. Such an operation point can lie closer to a mode jump in another operation point. Consequently, it will not suffice to control the laser with front power and frequency, since further relationships will be required.

Figure 3:
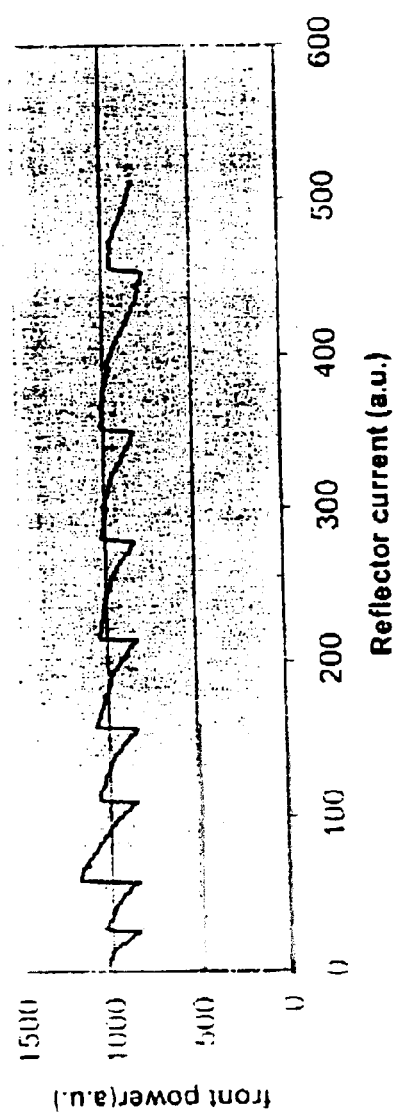
FIG. 3 is a diagram showing front power as a function of reflector stream in a DBR laser.
Figure 4:
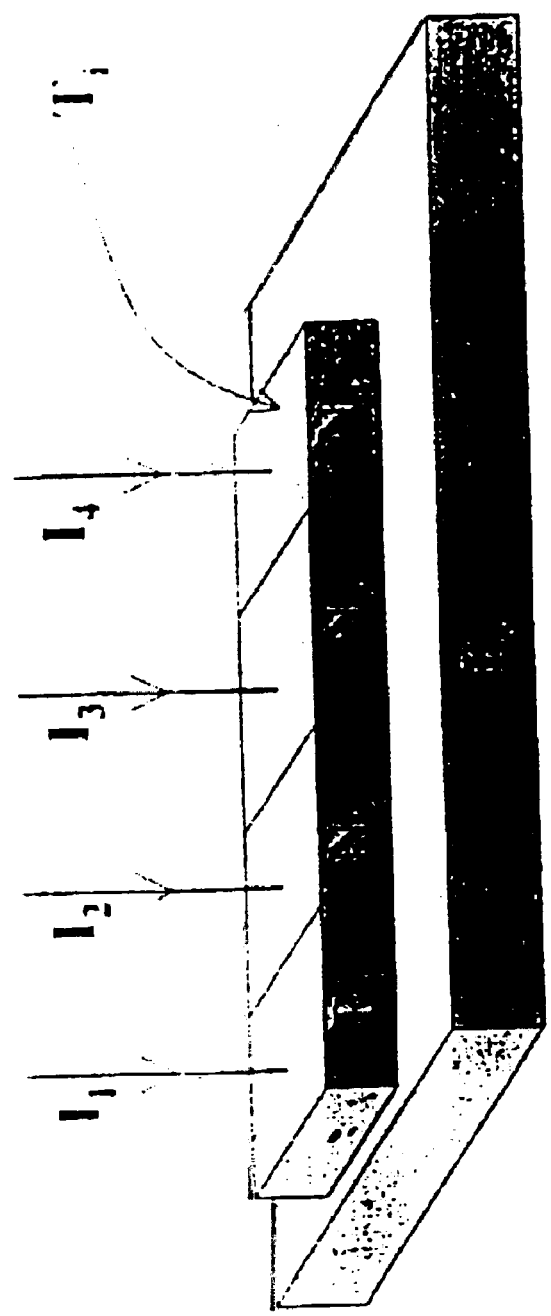
FIG. 4 is a schematic illustration of a laser that has four sections.

FIG. 3 is a diagram that illustrates the front power of a laser as a function of reflector current in a DBR laser. It will be seen from FIG. 3 that the front power varies significantly with respect to the reflector current.

According to the invention, there is chosen between the extreme values of the curve an operation point that is far away from points at which mode jumps occur.

It is also proposed in accordance with the invention that the values of one or more of the measurable magnitudes are caused to be non-extreme values, where the measurable magnitudes include back power in addition to front power and frequency. The control currents for the gain section, phase section and reflector section of the laser are caused to be controlled on the basis of the measured values of said measurable magnitudes.

The invention is thus based on the realisation that in the case of a laser that has at least three sections the back power and the front power can vary independently of each other, and on the realisation that degradation of the laser can be compensated for by controlling the different laser sections such as to retain the chosen values of both front power and back power, despite non-extreme values being used for this control. This compensation means that the internal variables, or charge carrier density, are/is kept constant in the respective various sections of the laser.

The same applies to a laser that has four sections, such as a GCSR laser. This latter laser has a gain section (P1), a coupler section (N2), a phase section (N3) and a reflector section (N4).

The measurable magnitudes are front power, back power, frequency and spontaneous emission from the coupler section, the phase section and the reflector section. The spontaneous emission; can be measured in a known manner at the front mirror, back mirror or on one side of the laser.

The spontaneous emission is measured by filtering out the wavelength of the laser light.

The invention also relates to the frequency and mode stabilisation of a tuneable laser that includes four sections, such as a GCSR laser, wherein the measurable magnitudes are comprised of the back power and a fourth magnitude in addition to the front power and the frequency of the laser. The fourth magnitude is the so-called spontaneous emission from the coupler section, the phase section and the reflector section. Control currents I1, I2, I3, I4 for the gain section P1, coupler section N2, phase section N3, and reflector section N4 respectively of said laser are caused to be controlled on the basis of the values measured in respect of the measurable magnitudes, wherein the coupler section or the reflector section or both sections are controlled on the basis of the spontaneous emission.

Figure 2:
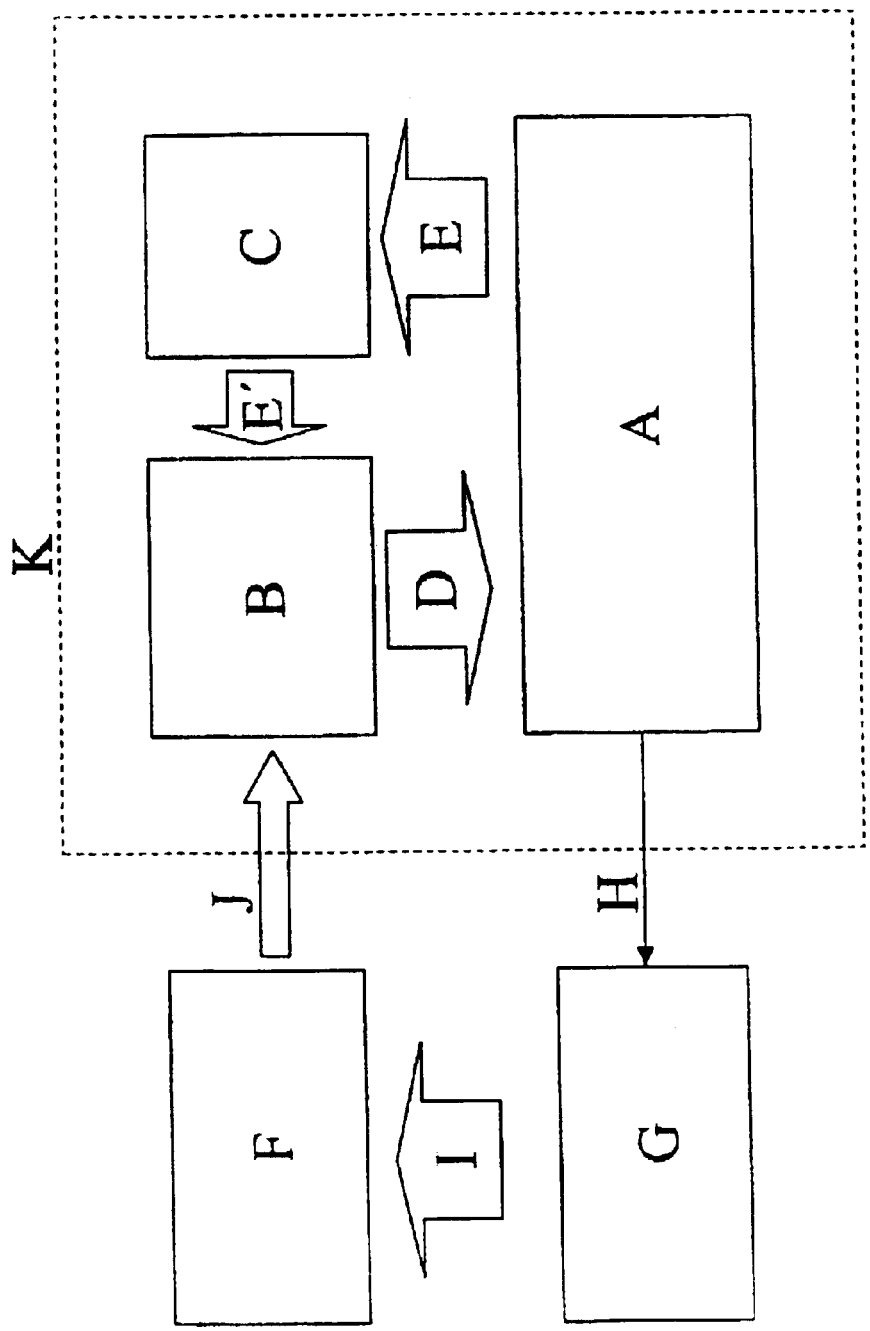
FIG. 2 is a block diagram.

FIG. 2 illustrates a control circuit and devices used in characterising a laser. In operation, the laser A is connected to a microprocessor B and to variable measuring units C. The laser A is controlled by the microprocessor B, which controls and adjusts the control currents D to the laser sections. These adjustments are based on measurements E from the measuring units C. The microprocessor B compares data E' received from the measuring units C with predetermined values that were obtained when characterising the laser, these values being found stored in the microprocessor. Upon completion of the comparison, the microprocessor makes any adjustments necessary to the control currents to the different laser sections.

In characterising the laser, the light H emitted is detected, for instance with respect to its power, sidemode suppression, frequency, etc., by analysing the light in a measuring instrument G that may include a spectrum analyser and a wavelength meter. The measured values I are sent to a computer F which is programmed to select optimal operation points, these operation points J then being transmitted to the microprocessor B.

It will thus be apparent that the present invention not only eliminates the extension of relationships as a result of degradation, but also provides a sufficient number of control variables to cause the laser to operate in the same operation point as that chosen when characterising the laser.

It will also be apparent that the present invention solves the problem mentioned in the introduction.

Although the invention has been described above with reference to a number of exemplifying embodiments, it will be understood that the invention can be applied with lasers other than Bragg lasers and GCSR lasers.

It will therefore be understood that the invention is not restricted to these described and illustrated embodiments thereof, since variations can be made within the scope of the following claims.

What is claimed is:

1. A method for frequency and mode stabilizing a tunable laser having at least a gain section, a phase section and a reflector section, measurable characteristics of the laser having been measured and resultant measured values of the characteristics having been stored in a memory, the laser having been characterized with respect to a number of operation points, the measured values of one or more of the measurable characteristics being non-extreme values, the measurable characteristics including front and rear powers, and frequency, the method comprising:

controlling control currents for the gain, phase and reflector sections based on the measured values while keeping both the front power and rear power constant.

2. A method according to claim 1, wherein the reflector section includes a Bragg reflector.

3. A method according to claim 2, the laser includes the following three sections: a gain section, a phase section and a Bragg reflector section.

4. A method according to claim 1, wherein the laser has at least four sections, including a gain section, a phase section, a coupler section and a reflector section, wherein controlling the control currents further includes controlling a control current for the coupler section.

5. A method according to claim 4, wherein the measurable characteristics include spontaneous emission from the coupler section, the phase section and the reflector section, and controlling the control currents includes controlling the control current of at least one of the coupler section and the reflector section in response to the measured spontaneous emission.

* * * * *